US008524331B2

(12) United States Patent
Honda

(10) Patent No.: US 8,524,331 B2
(45) Date of Patent: Sep. 3, 2013

(54) SUBSTRATE PROCESSING METHOD

(75) Inventor: Masanobu Honda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 282 days.

(21) Appl. No.: 12/943,967

(22) Filed: Nov. 11, 2010

(65) Prior Publication Data

US 2011/0117288 A1 May 19, 2011

Related U.S. Application Data

(60) Provisional application No. 61/296,314, filed on Jan. 19, 2010.

(30) Foreign Application Priority Data

Nov. 16, 2009 (JP) ................................. 2009-261018

(51) Int. Cl.
*H05H 1/24* (2006.01)
(52) U.S. Cl.
USPC ............................ 427/569; 427/578; 427/97.7
(58) Field of Classification Search
USPC ......................................... 427/569, 578, 97.7
See application file for complete search history.

(56) References Cited

U.S. PATENT DOCUMENTS

| 5,322,590 | A * | 6/1994 | Koshimizu | 438/9 |
| 6,403,848 | B1 * | 6/2002 | Moon et al. | 570/159 |
| 2003/0129851 | A1 * | 7/2003 | Akahori | 438/788 |
| 2004/0084714 | A1 * | 5/2004 | Ishii et al. | 257/315 |
| 2004/0197990 | A1 * | 10/2004 | Hieda | 438/253 |
| 2005/0194840 | A1 * | 9/2005 | Mori et al. | 307/131 |
| 2009/0017620 | A1 * | 1/2009 | Oda | 438/666 |
| 2010/0055911 | A1 * | 3/2010 | Fujihara | 438/694 |
| 2010/0068836 | A1 * | 3/2010 | Yatagai et al. | 438/17 |
| 2010/0255218 | A1 * | 10/2010 | Oka et al. | 427/579 |

FOREIGN PATENT DOCUMENTS

| JP | 2006-514783 | 5/2006 |
| JP | 2007-194284 | 8/2007 |
| JP | 2007-273866 | 10/2007 |

OTHER PUBLICATIONS

Visconti, P., et al., "Nanopatterning of organic and inorganic materials by holographic lithography and plasma etching". Microelectronic Engineering 53 (2000) 391-394.*
Xu, Lin, et al., "Nanopantography: A New Method for Massively Parallel Nanopatterning over Large Areas". Nano Letters 2005 vol. 5, No. 12, pp. 2563-2568.*

* cited by examiner

*Primary Examiner* — Bret Chen
(74) *Attorney, Agent, or Firm* — Pearne & Gordon LLP

(57) ABSTRACT

A substrate processing method effectively suppresses non-uniformity in deposition degree on a surface of a substrate. The substrate processing method includes depositing a deposit on a sidewall of each opening of a resist pattern, which is formed on an antireflection film on an etching target film of the substrate and is provided with a plurality of openings, before etching the etching target film of the substrate. Plasma is generated in the depositing process by introducing a CHF-based gas into the processing chamber at a flow rate equal to or higher than about 1000 sccm while a pressure in the processing chamber is set to equal to or higher than about 100 mTorr.

6 Claims, 14 Drawing Sheets

*FIG. 8C*

| FLOW RATE | 1500sccm |
|---|---|
| CENTER | (diagram with labels 260, 270, 250, 240, 230, C) |
| EDGE | (diagram with labels 260, 270, 250, 240, 230, E) |
| ΔCD (=C−E) | 4nm |

*FIG. 8D*

| FLOW RATE | 3000sccm |
|---|---|
| CENTER | (diagram with labels 260, 270, 250, 240, 230, C) |
| EDGE | (diagram with labels 260, 270, 250, 240, 230, E) |
| ΔCD (=C−E) | 0nm |

| PRESSURE IN PROCESSING CHAMBER | CENTER PORTION | CD |
|---|---|---|
| 75mTorr |  | T=208nm<br>B= 44nm |
| 150mTorr |  | T= 97nm<br>B=109nm |
| 200mTorr |  | T=107nm<br>B=131nm |
| 250mTorr |  | T=157nm<br>B=145nm |

SUBSTRATE PROCESSING METHOD

CROSS-REFERENCE TO RELATED APPLICATION

This application claims the benefit of Japanese Patent Application No. 2009-261018 filed on Nov. 16, 2009 and U.S. Provisional Application Ser. No. 61/296,314 filed on Jan. 19, 2010, the entire disclosures of which are incorporated herein by reference.

FIELD OF THE INVENTION

The present disclosure relates to a substrate processing method and a substrate processing apparatus for performing a deposition process for depositing a thin film on a substrate such as a semiconductor wafer or a FPD substrate and also relates to a storage medium.

BACKGROUND OF THE INVENTION

In a manufacturing process of a semiconductor device or a flat panel such as a liquid crystal display, a desired microscopic structure (e.g., holes, trenches, or the like) pattern is formed on a substrate such as a semiconductor wafer or a FPD substrate by performing various processes such as a film forming process and an etching process on the substrate. Recently, the semiconductor device tends to be highly integrated year by year. To meet a demand for miniaturization of patterns formed on the substrate, improvement in resist materials or exposure technology has been sought for and, thus, dimensions of an opening of a resist pattern are getting finer.

Along with the miniaturization of the semiconductor device, there has occurred a problem that when an etching target film on a substrate is etched by using a resist pattern as a mask, dimensions of the opening of the resist pattern may be enlarged or a sidewall of a recess in the etching target film may be overetched, resulting in a deviation of a critical dimension (CD) of a hole or a trench from a target value and a failure to obtain designed device characteristics.

Recently, as a solution to this problem, various researches have been conducted to develop a technique for preventing a deviation of a critical dimension of a pattern formed on an etching target film from a target value or to develop a technique for forming a pattern of an opening dimension smaller than an opening dimension of the resist pattern on an etching target film. In such techniques, an etching process is performed after reducing the opening dimension of the resist pattern by performing a deposition process for depositing a deposit on the resist pattern by supplying, e.g., a CHF-based processing gas (see, for example, Patent Documents 1 and 2).

Patent Document 1: Japanese Patent Laid-open Publication No. 2007-194284
Patent Document 2: Japanese Patent Laid-open Publication No. 2007-273866

In the deposition process, a deposit may be uniformly and effectively deposited on a sidewall of an opening of the resist pattern by increasing radical density. To increase the radical density, it may be desirable to supply a processing gas after increasing an internal pressure of a processing chamber to, e.g., about 100 mTorr or higher.

In the deposition process, however, as the internal pressure of the processing chamber increases, critical dimensions of patterns formed after the etching was observed to become non-uniform. As the internal pressure of the processing chamber increases, dissociation of the processing gas may be facilitated, and, thus, a difference in dissociation degree of the processing gas may be generated in a diametric direction of the substrate, which in turn may cause non-uniformity in deposition degree on the surface of the substrate. Thus, the non-uniformity in the critical dimensions of the patterns on the substrate is deemed to be caused by such non-uniformity in the deposition degree on the surface of the substrate. Although the non-uniformity of the critical dimensions is in the order of nanometer (nm), such a slight degree of non-uniformity may not be regarded negligible to meet a demand for further miniaturization of the patterns.

BRIEF SUMMARY OF THE INVENTION

In view of the foregoing, the present disclosure provides a substrate processing apparatus capable of effectively suppressing non-uniformity in deposition degree on a surface of a substrate even if an internal pressure of a processing chamber is increased.

In accordance with one aspect of the present disclosure, there is provided a substrate processing method for performing a preset process on a substrate mounted on a lower electrode by using plasma of a gas excited by applying a high frequency power between an upper electrode and the lower electrode installed to face each other in an evacuable processing chamber. The substrate processing method includes depositing a deposit on a sidewall of each opening of a resist pattern, which is formed on an antireflection film on an etching target film of the substrate and is provided with a plurality of openings, before etching the etching target film of the substrate. Plasma is generated in the depositing process by introducing a CHF-based gas into the processing chamber at a flow rate equal to or higher than about 1000 sccm while a pressure in the processing chamber is set to be equal to or higher than about 100 mTorr.

In accordance with another aspect of the present disclosure, there is provided a substrate processing apparatus that performs a preset process on a substrate mounted on a lower electrode by using plasma of a gas excited by applying a high frequency power between an upper electrode and the lower electrode installed to face each other in an evacuable processing chamber. The substrate processing apparatus includes a power supply unit that applies a high frequency power to the lower electrode; a gas supply unit that supplies the gas into the processing chamber; a gas exhaust unit that evacuates the processing chamber and depressurizes the inside of the processing chamber to a preset pressure; and a controller that performs a depositing process for depositing a deposit on a sidewall of each opening of a resist pattern, which is formed on an antireflection film on an etching target film of the substrate and is provided with a plurality of openings, before etching the etching target film of the substrate. The controller generates plasma in the depositing process by introducing a CHF-based gas into the processing chamber at a flow rate equal to or higher than about 1000 sccm while a pressure in the processing chamber is set to be equal to or higher than about 100 mTorr.

In accordance with still another aspect of the present disclosure, there is provided a computer readable storage medium that stores therein a program for implementing the depositing process.

By way of example, the CHF-based gas may be a $CHF_3$ gas. Here, desirably, a flow rate of the $CHF_3$ gas may range from about 1500 sccm to about 3000 sccm. Further, the pressure in the processing chamber may be equal to or higher than about 150 mTorr in the depositing process. Furthermore, a residence time of the gas may be equal to or less than about 0.1 second in the depositing process. Moreover, lower resist film may be formed between the etching target film and the antireflection film of the substrate.

Here, in the present specification, 1 mTorr is about $(10^{-3} \times 101325/760)$ Pa, and 1 sccm is about $(10^{-6}/60)$ m³/sec.

In accordance with the present disclosure, in the depositing process performed prior to the etching process, by increasing the flow rate of the gas greatly as compared to a conventional flow rate, non-uniformity in deposition degree on the surface of the substrate can be effectively suppressed even if the internal pressure of the processing chamber is increased. Accordingly, the deposit can be uniformly deposited on the sidewall of the opening of the resist pattern, and uniformity in deposition degree on the surface of the substrate can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 8C is a diagram for comparing openings at a center portion and an edge portion of a wafer W when the flow rate of the processing gas is set to about 1500 sccm in FIG. 7;

FIG. 8D is a diagram for comparing openings at a center portion and an edge portion of a wafer W when the flow rate of the processing gas is set to about 3000 sccm in FIG. 7;

DETAILED DESCRIPTION OF THE INVENTION

Figure 1:
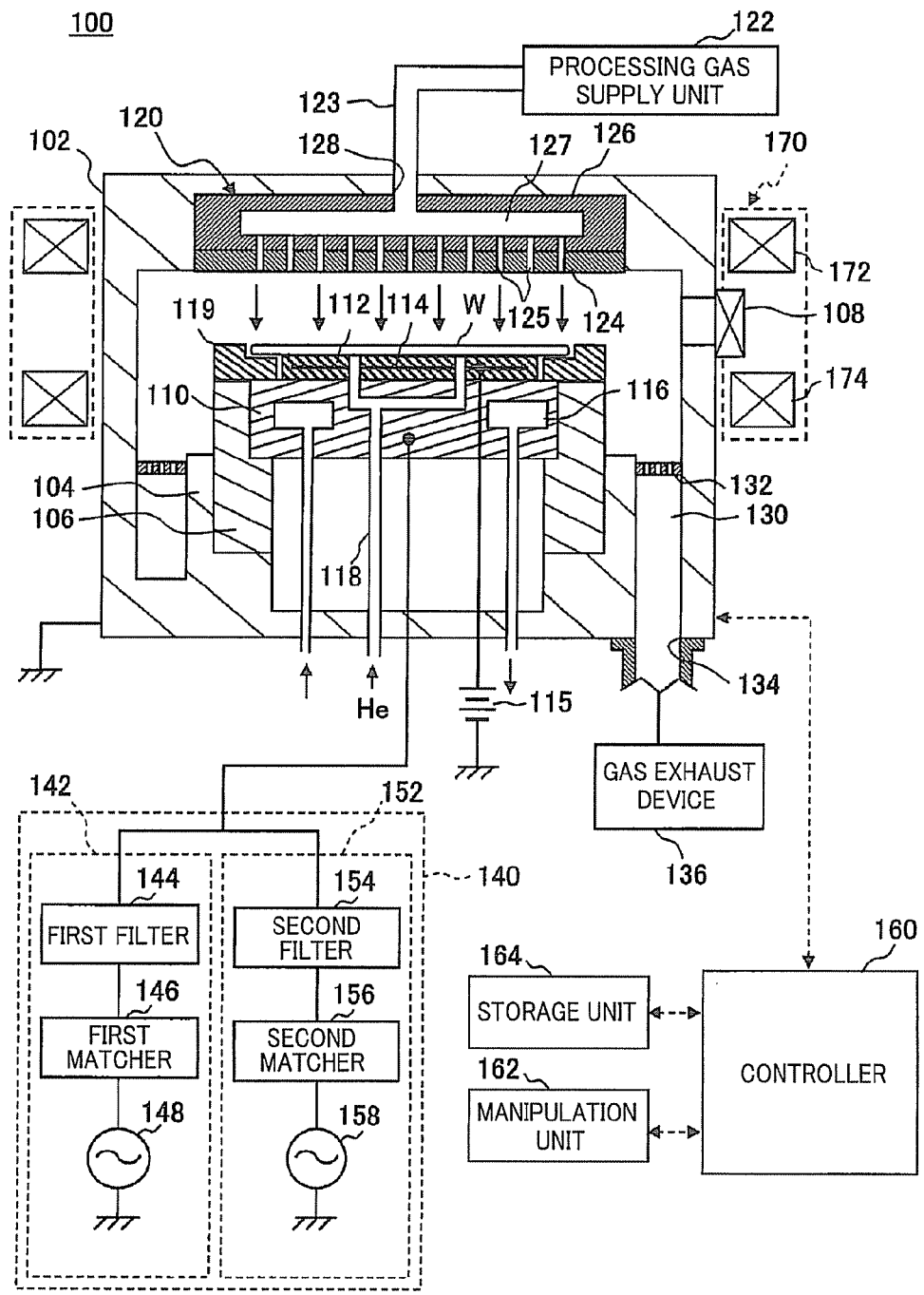
FIG. 1 is a cross sectional view illustrating a plasma processing apparatus in accordance with an embodiment of the present disclosure.

Hereinafter, embodiments of the present disclosure will be explained in detail with reference to accompanying drawings. Through the present specification and drawings, parts having substantially same function and configuration will be assigned same reference numerals, and redundant description will be omitted.

(Configuration Example of a Substrate Processing Apparatus)

Above all, a configuration example of a substrate processing apparatus in accordance with an embodiment of the present disclosure will be explained with reference to the drawings. Herein, there will be explained a substrate processing apparatus configured as a plasma processing apparatus in which an etching target film on a wafer W is etched by applying a first high frequency power (high frequency power for plasma generation) of a relatively high frequency of, e.g., about 40 MHz and a second high frequency power (high frequency power for a bias voltage) of a relatively low frequency of, e.g., about 13.56 MHz to a single electrode (lower electrode) serving as a mounting table. FIG. 1 is a cross sectional view showing a schematic configuration of a plasma processing apparatus in accordance with the present embodiment.

As illustrated in FIG. 1, the plasma processing apparatus 100 may include a processing chamber 102 having a cylinder-shaped processing vessel made of metal such as aluminum or stainless steel of which a surface is anodically oxidized (alumite treated). The processing chamber 102 is grounded. In the processing chamber 102, there is provided a circular plate-shaped lower electrode (a susceptor) 110 also serving as a mounting table for mounting a substrate such as a semiconductor wafer W (hereinafter, simply referred to as "wafer")

and an upper electrode 120 also serving as a shower head configured to face the lower electrode 110 and supply a processing gas or a purge gas.

The lower electrode 110 is made of, for example, aluminum. The lower electrode 110 is held on an insulating cylindrical holder 106 on a cylindrical member 104 extended in a vertically upward direction from a bottom of the processing chamber 102. On a top surface of the lower electrode 110, an electrostatic chuck 112 for holding the wafer W by an electrostatic attracting force is installed. The electrostatic chuck 112 may include an electrostatic chuck electrode 114 made of, for example, a conductive film embedded in an insulating film. The electrostatic chuck electrode 114 is electrically connected with a DC power supply 115. With this configuration of the electrostatic chuck 112, the wafer W can be attracted to and held on the electrostatic chuck 112 by a Coulomb force caused by a DC voltage from the DC power supply 115.

Installed within the lower electrode 110 is a cooling unit. By way of example, this cooling unit is configured to circulate and supply a coolant (for example, cooling water) at a predetermined temperature to a cooling reservoir 116 extended in a circumferential direction in the lower electrode 110 from a non-illustrated chiller unit through a coolant line. A processing temperature of the wafer W on the electrostatic chuck 112 can be controlled by the coolant.

In the lower electrode 110 and the electrostatic chuck 112, a heat transfer gas supply line 118 is provided toward a rear surface of the wafer W. A heat transfer gas (a backgas) such as a He gas is introduced through the heat transfer gas supply line 118 and supplied between a top surface of the electrostatic chuck 112 and the rear surface of the wafer W. Accordingly, a heat transfer between the lower electrode 110 and the wafer W is accelerated. A focus ring 119 is installed so as to surround the wafer W mounted on the lower electrode 110. The focus ring 119 is made of, for example, quartz or silicon and installed on a top surface of the cylindrical holder 106.

The upper electrode 120 is provided at a ceiling of the processing chamber 102. The upper electrode 120 is grounded. The upper electrode 120 is connected with a processing gas supply unit 122 which supplies a gas required for a process in the processing chamber 102 via a gas line 123. By way of example, the processing gas supply unit 122 may include a gas supply source which supplies a processing gas or a purge gas required for a process performed on a wafer or a cleaning process in the processing chamber 102, a valve and a mass flow controller which control introduction of a gas from the gas supply source.

The upper electrode 120 may include an electrode plate 124 having a plurality of gas vent holes 125 at a bottom surface and an electrode support 126 which supports the electrode plate 124 detachably attached thereto. Provided within the electrode support 126 is a buffer room 127. A gas inlet 128 of this buffer room 127 is connected with the gas line 123 of the processing gas supply unit 122.

FIG. 1 illustrates an example case where the processing gas supply unit 122 supplies a single processing gas through a single gas line, but the present disclosure is not limited thereto. By way of example, the present disclosure can be applied to a case where the processing gas supply unit 122 provides a plurality of processing gases. In this case, the plasma processing apparatus 100 may be provided with a plurality of gas supply sources, the processing gas supply unit 122 may provide a plurality of gases through a plurality of gas lines, and mass flow controllers may be provided on the respective gas lines.

By way of example, a halogen-based gas such as a Cl gas may be used as a processing gas supplied into the processing chamber 102 from the processing gas supply unit 122 to etch an oxide film. To elaborate, a $CHF_3$ gas may be used as a processing gas to etch a silicon oxide film such as a $SiO_2$ film. Further, a $BCl_3$ gas or a gaseous mixture of a $BCl_3$ gas and an $O_2$ gas may be used as a processing gas to etch a high-k thin film such as $HfO_2$, $HfSiO_2$, $ZrO_2$ and $ZrSiO_4$. Furthermore, a gaseous mixture of a HBr gas and an $O_2$ gas may be used as a processing gas to etch a polysilicon film.

Further, a CHF-based gas may be used as a processing gas in a deposition process (to be described later) before an etching process. By way of example, a $CHF_3$ gas may be used as a processing gas in the deposition process of the present disclosure.

Formed between a sidewall of the processing chamber 102 and the cylindrical member 104 is a gas exhaust path 130. A ring-shaped baffle plate 132 is positioned at an entrance of the gas exhaust path 130 or on its way, and a gas exhaust port 134 is provided at a bottom portion of the gas exhaust path 130. The gas exhaust port 134 is connected with a gas exhaust device 136 via a gas exhaust pipe. The gas exhaust device 136 includes, for example, a vacuum pump and is configured to depressurize the inside of the processing chamber 102 to a certain vacuum level. Further, installed at the sidewall of the processing chamber 102 is a gate valve 108 which opens and closes a loading/unloading port for the wafer W.

The lower electrode 110 is connected with a power supply device 140 which supplies dual frequency powers thereto. The power supply device 140 may include a first high frequency power supply unit 142 which supplies a first high frequency power (high frequency power for generating plasma) of a first frequency and a second high frequency power supply unit 152 which supplies a second high frequency power (high frequency power for generating a bias voltage) of a second frequency lower than the first frequency.

The first high frequency power supply unit 142 may include a first filter 144, a first matcher 146, and a first power supply 148 connected to the lower electrode 110 in sequence. The first filter 144 prevents the second frequency power from entering into the first matcher 146. The first matcher 146 matches the first high frequency power.

The second high frequency power supply unit 152 may include a second filter 154, a second matcher 156, and a second power supply 158 connected to the lower electrode 110 in sequence. The second filter 154 prevents the first frequency power from entering into the second matcher 156. The second matcher 156 matches the second high frequency power.

A magnetic field generation unit 170 is provided so as to surround the processing chamber 102. The magnetic field generation unit 170 may include an upper magnet ring 172 and a lower magnet ring 174 vertically spaced from each other and arranged along a circumference of the processing chamber 102. The magnetic field generation unit 170 generates a cusp magnetic field which surrounds a plasma processing space in the processing chamber 102. The magnetic field generation unit 170 may not be provided.

The plasma processing apparatus 100 is connected with a controller (an overall control device) 160, and each component of the plasma processing apparatus 100 is controlled by this controller 160. Further, the controller 160 is connected with a manipulation unit 162 including a keyboard through which an operator inputs commands to manage the plasma processing apparatus 100 or a display which visually displays an operation status of the plasma processing apparatus 100.

Furthermore, the controller 160 is connected with a storage unit 164 that stores therein: programs for implementing various processes (e.g., a plasma process on the wafer W) performed in the plasma processing apparatus 100 under the control of the controller 160; and processing conditions (recipes) required for executing the programs.

By way of example, the storage unit 164 stores a plurality of processing conditions (recipes). Each processing condition includes a plurality of parameter values such as control parameters controlling each component of the plasma processing apparatus 100 and setting parameters. By way of example, each processing condition may include parameter values such as a flow rate ratio of processing gases, a pressure in a processing chamber, and a high frequency power value.

Moreover, the programs or processing conditions may be stored in a hard disc or a semiconductor memory, or may be set in a predetermined area of the storage unit 164 in the form of a storage medium readable by a portable computer such as a CD-ROM or a DVD.

The controller 160 reads out a program and processing condition from the storage unit 164 in response to an instruction from the manipulation unit 162 and controls each component, thereby carrying out a desired process in the plasma processing apparatus 100. Further, the processing condition can be edited by the manipulation unit 162.

(Operation of the Plasma Processing Apparatus)

Now, an operation of the plasma processing apparatus 100 will be described. By way of example, in order to perform a plasma process on a wafer W, the wafer W to be processed is loaded into the processing chamber 102 through the gate valve 108 by a non-illustrated transfer arm. If the wafer W is mounted on the lower electrode 110, i.e., on the electrostatic chuck 112, the DC power supply 115 is turned on, and the wafer W is firmly attracted and held on the electrostatic chuck 112. Then, the plasma process is begun.

The plasma process is performed based on preset processing conditions (recipes). To elaborate, the inside of the processing chamber 102 is depressurized to a preset pressure, and processing gases are introduced into the processing chamber 102 at preset flow rates and at a preset flow rate ratio. In this state, a first high frequency power equal to or higher than about 10 MHz, e.g., about 100 MHz, is applied to the lower electrode 110 from the first high frequency power supply 148, and a second high frequency power equal to or higher than about 2 MHz and less than about 10 MHz, e.g., about 3 MHz, is applied to the lower electrode 110 from the second high frequency power supply 158. Accordingly, plasma of the processing gases is generated between the lower electrode 110 and the upper electrode 120 by the first high frequency power, and a self-bias voltage (−Vdc) is generated in the lower electrode 110 by the second high frequency power, so that the plasma process on the wafer W can be carried out. In this way, by applying both the first high frequency power and the second high frequency power to the lower electrode 110, the plasma can be appropriately controlled, and, thus, effective plasma process can be carried out.

Upon the completion of the plasma process, the attracting force of the electrostatic chuck 112 is removed by turning off the DC power supply 115, and the wafer W is unloaded through the gate valve 108 by the non-illustrated transfer arm.

(Plasma Process on a Wafer)

Figure 2:
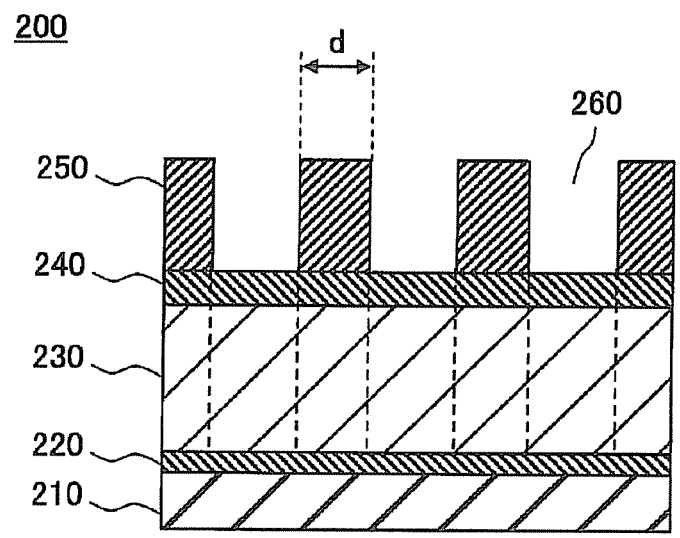
FIG. 2 is a diagram illustrating an example film structure of a wafer before etching.
Figure 3:
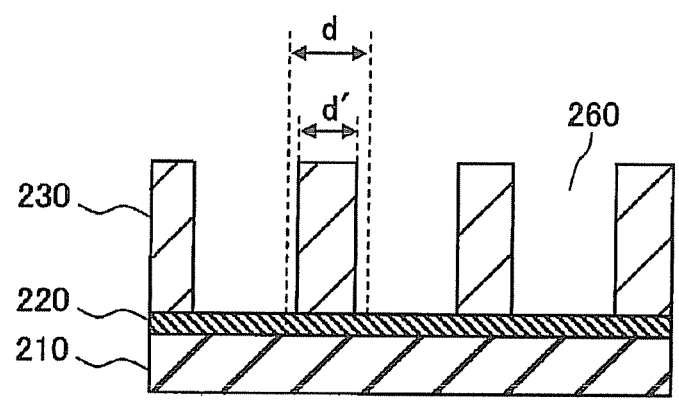
FIG. 3 is a diagram illustrating an example film structure of a wafer after etching.

Now, a plasma process on a wafer W will be described in further detail with reference to the accompanying drawings. Here, the description will be provided for a case of forming trench patterns in an etching target film 230 as shown in FIG. 3 by performing etching on a wafer W having a film structure 200 as illustrated in FIG. 2. The film structure 200 depicted in FIG. 2 includes an oxide film 220, an etching target film 230, an antireflection film 240 and a resist pattern 250 stacked in sequence on a silicon (Si) base 210. The resist pattern 250 is previously patterned to have openings 260 where trenches are to be formed.

When the etching target film 230 on the wafer W having the illustrated film structure is etched, the antireflection film 240 is first etched by using the resist pattern 250 as a mask, and the etching target film 230 is then etched. Thereafter, the remaining antireflection film 240 and the resist pattern 250 are removed, so that trenches as shown in FIG. 3 can be formed.

Here, if etching is performed on the wafer W having the film structure 200, an opening dimension of the resist pattern may be enlarged or a sidewall of a recess in the etching target film may be overetched, resulting in a deviation of a critical dimension (e.g., a hole diameter, or a line width or a groove width of a trench) of a hole or a trench from a target value. In such a case, designed device characteristics may not be obtained. FIG. 3 shows an example in which a line width d' of a trench becomes smaller than a target value d.

To prevent this problem, in the present embodiment, a deposition process for depositing a deposit on the resist pattern 250 is performed prior to performing the etching process. By performing the deposition process, the opening dimension of the resist pattern 250 is reduced, and then the etching is carried out in this state. In the deposition process, plasma is generated by supplying a processing gas such as a CHF-based gas into the processing chamber 102 that is maintained at a preset pressure.

In this deposition process, density of radicals as precursors may be increased to deposit the deposit on the resist pattern in a good condition. For the purpose, it may be desirable to supply the processing gas after increasing an internal pressure of the processing chamber 102.

However, it was found out that as the internal pressure of the processing chamber 102 increases in the deposition process, a slight degree of non-uniformity in the order of nanometer (nm) may be generated in critical dimensions of the line width or the groove width of the trench formed after the etching.

Through various experiments, the present inventor has found out that non-uniformity in deposition degree on the surface of the wafer can be greatly suppressed by increasing a flow rate of the processing gas. By increasing the flow rate of the processing gas, a difference in dissociation degree of the processing gas in a diametric direction of the wafer may be suppressed, and, thus, non-uniformity in the deposition degree on the surface of the wafer can be suppressed.

That is, as the internal pressure of the processing chamber 102 increases, the processing gas may be excessively dissociated, and, thus, a difference in dissociation degree may be generated in the diametric direction of the wafer, resulting in non-uniformity in the deposition degree on the surface of the wafer. As a solution, by increasing the flow rate of the processing gas, the difference in dissociation degree in the diametric direction of the wafer can be suppressed, and, thus, non-uniformity in the deposition degree on the surface of the wafer can also be suppressed.

Figure 4:
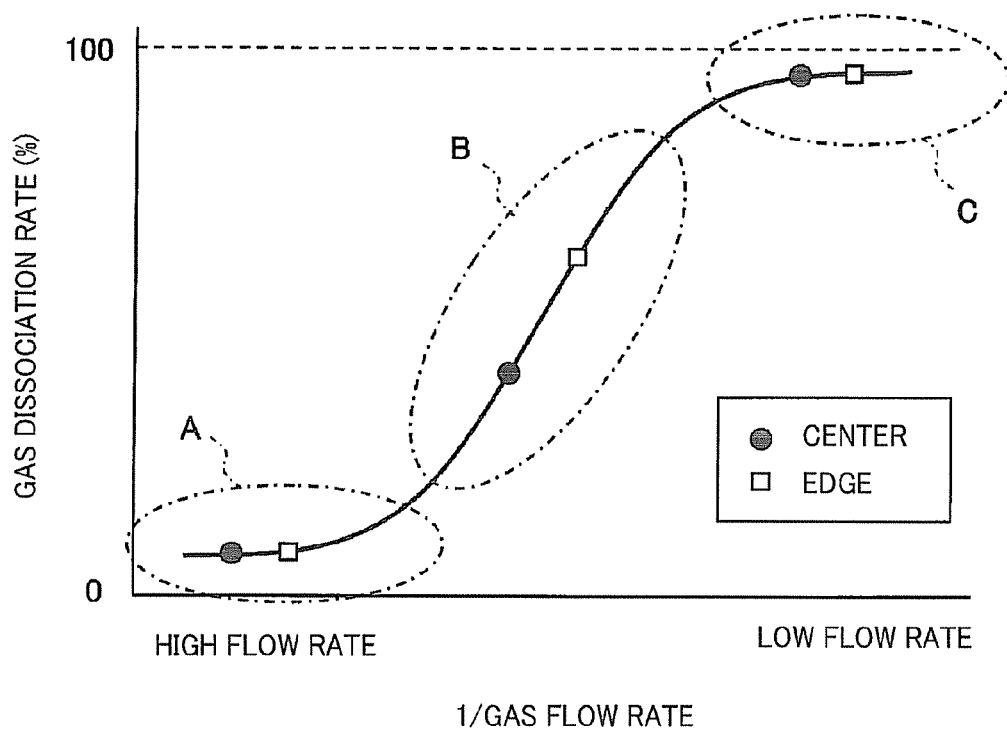
FIG. 4 is a diagram showing a relationship between a flow rate of a processing gas and a gas dissociation rate.

This effect will be explained in more detail by using a relationship between a dissociation degree and a flow rate of a processing gas. In general, the relationship between a gas flow rate and a gas dissociation degree may be depicted as a curve as shown in FIG. 4. Here, a horizontal axis represents a reciprocal of the gas flow rate and a vertical axis represents a percentage of the dissociation degree. In FIG. 4, black circles indicate dissociation degrees at a center portion on the surface of the wafer, while white squares indicate dissociation degrees at an edge portion (peripheral portion) thereof.

From an overall point of view, FIG. 4 indicates that a gas dissociation rate tends to increase as a flow rate of the processing gas decreases, as can be seen from a region B of the curve. If the flow rate of the processing gas increases beyond those of the region B, however, there is found a region A where the gas dissociation rate hardly changes.

Since the gas dissociation degree may slightly change depending on positions (here, center portion and edge portion) on the surface of the wafer W, positions on the curve of FIG. 4 may be deviated from each other. By way of example, if a gas flow rate is about 200 sccm as in a conventional case, it corresponds to the region B. If deposition is performed in the region B, there may be generated a difference in dissociation degrees at the center portion (black circle) and at the edge portion (white square) on the surface of the wafer.

In contrast, if the gas flow rate is increased to, e.g., about 1000 sccm, it corresponds to the region A. Thus, even if positions on the curve are deviated from each other, there may be hardly generated a difference in dissociation degrees at the center portion and the edge portion on the surface of the wafer. Therefore, non-uniformity in the deposition degree on the surface of the wafer is deemed to be suppressible by increasing the flow rate of the gas. Further, in the region C, although the gas dissociation degree hardly changes, the gas flow rate is excessively low. Thus, since a desired amount of deposit may not be deposited, this region may not be used.

Thus, in the present embodiment, etching is performed after the deposition process is performed by increasing the flow rate of the processing gas to about 1000 sccm or greater. In this way, non-uniformity in opening dimensions of the resist pattern on the surface of the wafer can be suppressed, and, thus, non-uniformity in critical dimensions of the trenches formed after the etching can also be suppressed.

(Example of a Wafer Process)

Now, an example of performing a wafer process including a deposition process in accordance with the present embodiment by the plasma processing apparatus 100 will be explained with reference to the accompanying drawings. Here, a deposition process for depositing a deposit 270 on a resist pattern 250 having a trench-shaped opening 260 is first performed for a wafer W having a film structure 200 as illustrated in FIG. 2. Then, an etching process and an ashing process are performed in sequence, so that a trench is formed.

Figure 5A:
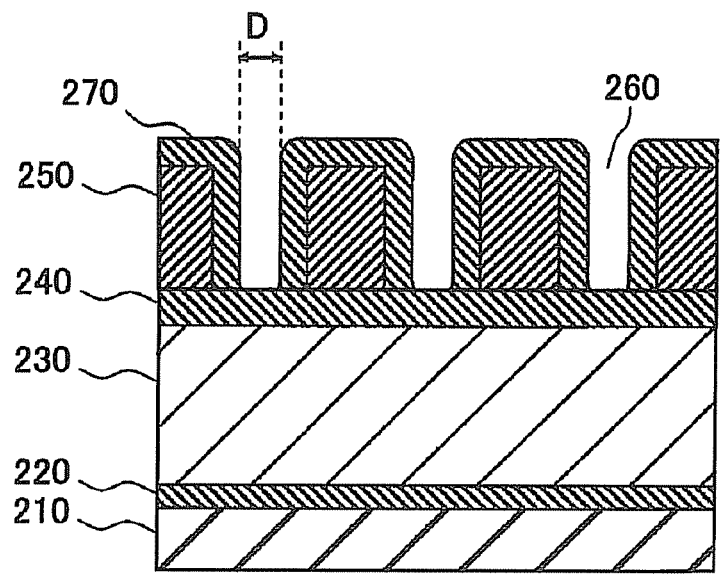
FIG. 5A is a diagram illustrating a film structure after a deposition process is performed in the course of forming a trench in an etching target film on a wafer.
Figure 5B:
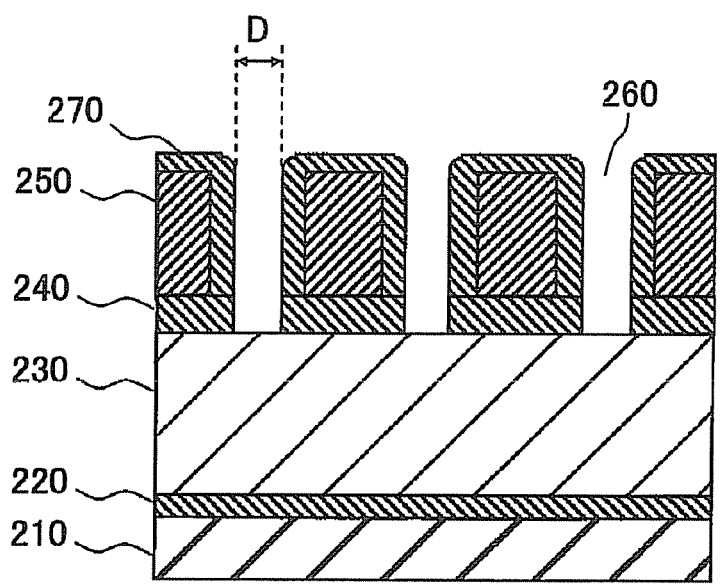
FIG. 5B is a diagram illustrating a film structure after an antireflection film is etched on the film structure shown in FIG. 5A.
Figure 5C:
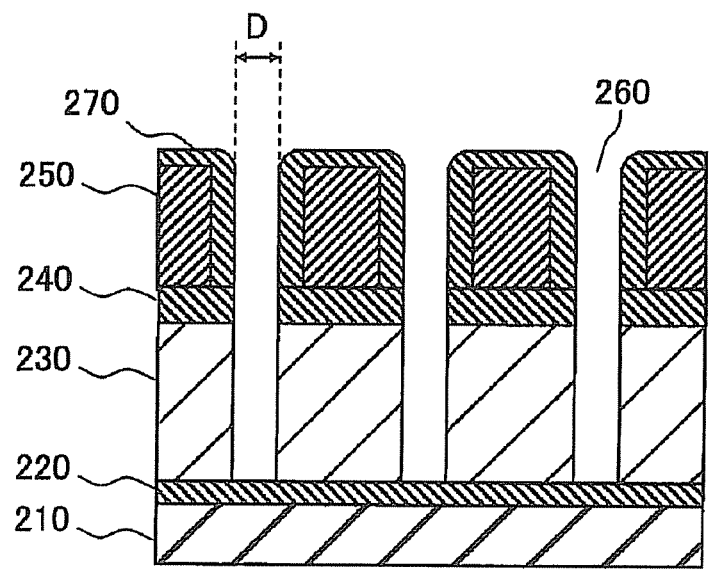
FIG. 5C is a diagram illustrating a film structure after the etching target film is etched on the film structure shown in FIG. 5B.
Figure 5D:
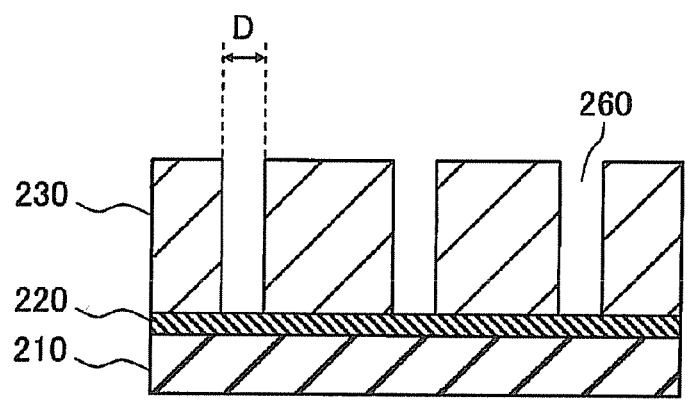
FIG. 5D is a diagram illustrating a film structure after ashing is performed on the film structure shown in FIG. 5C.
Figure 6:
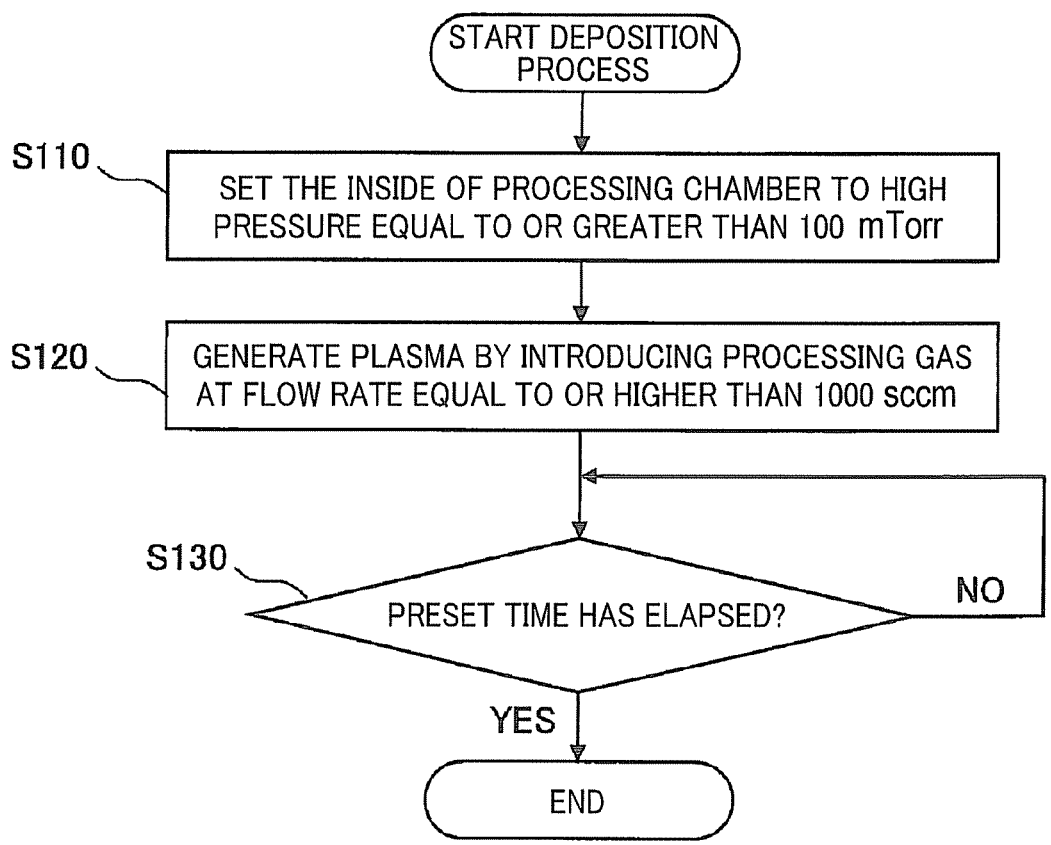
FIG. 6 is a flowchart for describing a deposition process in accordance with the embodiment of the present disclosure.

FIGS. 5A to 5D are schematic diagrams illustrating film structures in the respective processes of the present example. FIG. 6 is a flowchart for describing the deposition process. Here, the wafer process may be performed under the control of the controller 160 which controls each component of the plasma processing apparatus 100 based on a preset program.

(Deposition Process)

First, a wafer is loaded into the processing chamber 102, and a deposition process as described in FIG. 6 is performed on the wafer W. To elaborate, in step S110, an internal pressure of the processing chamber 102 is set to a high pressure equal to or higher than, e.g., about 100 mTorr. Then, in step S120, a processing gas (e.g., a $CHF_3$ gas) for the deposition process is supplied into the processing chamber 102 at a high flow rate of about 1000 sccm or greater, and a first high frequency power and a second high frequency power are applied to the lower electrode 110, so that the processing gas is excited into plasma. In this way, the deposition process is begun, and a deposit containing, e.g., C and H starts to be deposited on the wafer W.

Subsequently, in step S130, it is determined whether or not a preset time for the deposition process has elapsed. If it is determined that the preset time has passed by, the deposition process is terminated. As a result, the deposit 270 is deposited on the wafer W in an appropriate film thickness, as illustrated in FIG. 5A. The deposit 270 is deposited on a sidewall of the opening 260 as well as on top of the resist pattern 250. Thus, a dimension D of a recess (or a dimension d of a protrusion shown in FIG. 2) can be controlled by adjusting the opening 260 of the resist pattern 250. Further, by way of example, the termination time of the deposition process may be stored in the storage unit 164 as a processing recipe and may be used after read out therefrom.

(Etching Process)

Subsequently, an etching process is performed after the deposit 270 is formed. In the etching process, an antireflection film 240 is first etched by using the deposit 270 as a mask, and an etching target film 230 is then etched. In the etching of the antireflection film 240, a gaseous mixture of, e.g., a $CH_3$ gas and a $CF_3I$ gas is supplied as an etching gas while controlling the internal pressure of the processing chamber 102, and the processing gas is excited into plasma by applying the first and second high frequency powers to the lower electrode 110. The antireflection film 240 is etched by the plasma. Here, the antireflection film 240 is an organic film, like the resist pattern 250 and the deposit 270. Thus, if the antireflection film 240 is etched, exposed portions of the resist pattern 250 and the deposit 270 may also be etched, and, thus, the etching target film 230 may be exposed in the bottom of the opening 260, as illustrated in FIG. 5B, for example.

Further, in case that a deposit 270 remains in the bottom of the opening 260, it may be desirable to reduce an etching rate of the deposit by controlling a flow rate ratio ($CHF_3$ gas/$CF_3I$ gas) in such a manner as to reduce a flow rate of the $CF_3I$ gas until the remaining deposit 270 is removed. In this way, since the deposit can be deposited on the sidewall of the opening 260 until the deposit in the bottom of the opening 260 is removed, the diameter of the opening 260 can be further reduced.

Thereafter, in case that the etching target film 230 is, e.g., a SiN film, a gaseous mixture of, e.g., a $CH_3$ gas, a $CF_4$ gas and an Ar gas is supplied as an etching gas in the etching process for the etching target film 230, and plasma of the processing gas is generated by applying the first and second high frequency powers to the lower electrode 110. The etching target film 230 is etched by the plasma and a trench is formed, as depicted in FIG. 5C.

Upon the completion of the etching process, an ashing process is performed, and the remaining resist pattern 250 and antireflection film 240 are removed. As a result, a trench having a groove width of a desired critical dimension is formed as shown in FIG. 5D.

(Result of Experiment Conducted While Varying a Gas Flow Rate)

Here, a result of an experiment in which a deposition process in accordance with the present embodiment is performed by the plasma processing apparatus 100 will be explained with reference to the accompanying drawings. In the experiment, an internal pressure of the processing chamber 102 was fixed at 150 mTorr, and a $CHF_3$ gas was used as a processing gas. The deposition process was performed while varying a flow rate of the $CHF_3$ gas. Here, a case of supplying the $CHF_3$ gas at a high flow rate equal to or greater than about 1000 sccm (1000 sccm, 1500 sccm and 3000 sccm) will be compared with a case of supplying the $CHF_3$ gas at a low flow rate of about 200 sccm.

Figure 7:
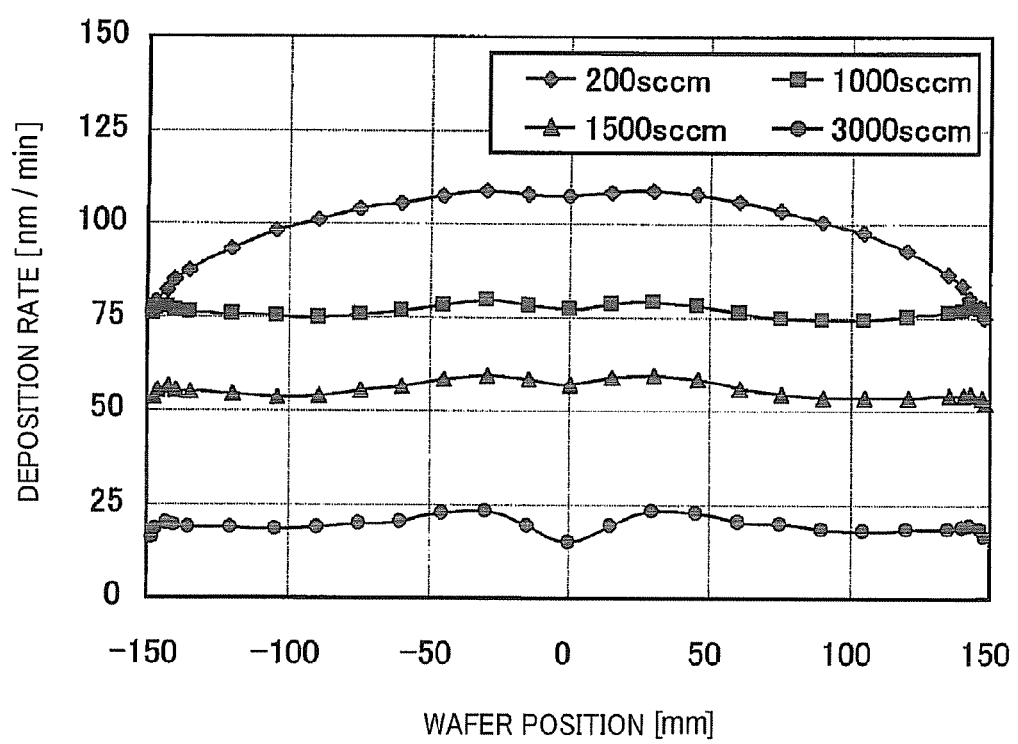
FIG. 7 is a diagram showing an experiment result of measuring a deposition rate on the surface of a wafer while varying a flow rate of a processing gas in the deposition process in accordance with the embodiment of the present disclosure.

FIG. 7 is a graph plotting deposition rates in a height direction of a wafer W after the deposition process is performed in the respective cases. In FIG. 7, a horizontal axis indicates a position on the surface of the wafer W, and a vertical axis indicates a deposition rate. Other processing conditions for the deposition process are as follows.

(Processing Conditions for the Deposition Process)
First high frequency power: 750 W
Second high frequency power: 300 W
Upper electrode temperature: 60° C.
Sidewall temperature: 60° C.
Lower electrode temperature: 40° C.
Processing time: 60 sec As can be seen from FIG. 7, when the $CHF_3$ gas is supplied at the high flow rates equal to or greater than 1000 sccm, uniformity of deposition rate on the surface is greatly improved as compared to the case of supplying the gas at the low flow rate of 200 sccm.

Furthermore, FIGS. 8A to 8D are diagrams for comparing openings at center portions and at edge portions of wafers W in the respective cases of 200 sccm, 1000 sccm, 1500 sccm and 3000 sccm. In each of FIGS. 8A to 8D, a critical dimension of a groove width (groove width (CD)) in a bottom portion of an opening at a wafer center portion is denoted by C; a critical dimension of a groove width (groove width (CD)) in a bottom portion of an opening at a wafer edge portion is denoted by E; and a dimensional difference between them is denoted by $\Delta CD$ (=C−E). When the gas flow rate is 200 sccm, $\Delta CD$ is about 18 nm, whereas $\Delta CD$ is found to decrease greatly to about 6 nm, about 4 nm and to 0 nm when the gas flow rate increases to 1000 sccm, 1500 sccm and to 3000 sccm.

Figure 9A:
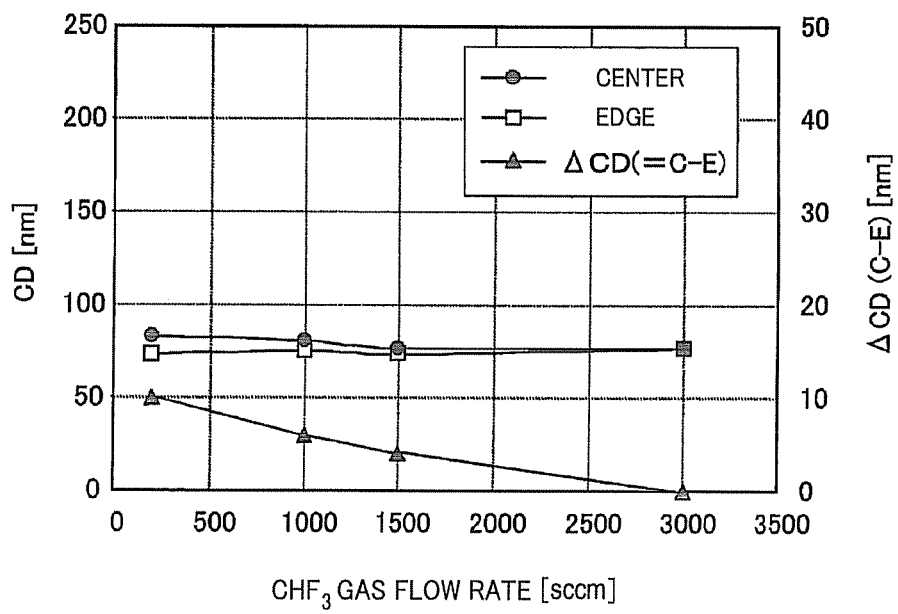
FIG. 9A is a diagram showing a relationship between a flow rate of a processing gas, groove widths (CD) at a center portion and an edge portion of a wafer and a dimensional difference ΔCD therebetween, in a case of using the wafer having a dense resist pattern in which a ratio between a line width and a groove width of a trench is about 1:1.
Figure 9B:
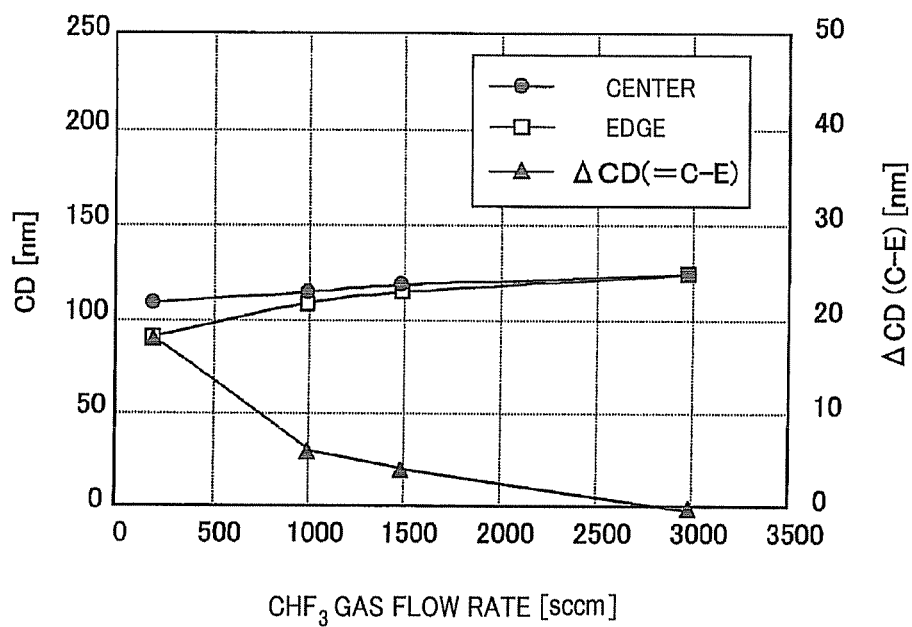
FIG. 9B is a diagram showing a relationship between a flow rate of a processing gas, groove widths (CD) at a center portion and an edge portion of a wafer and a dimensional difference ΔCD therebetween, in a case of using the wafer having a dense resist pattern in which a ratio between a line width and a groove width of a trench is about 1:2.
Figure 9C:
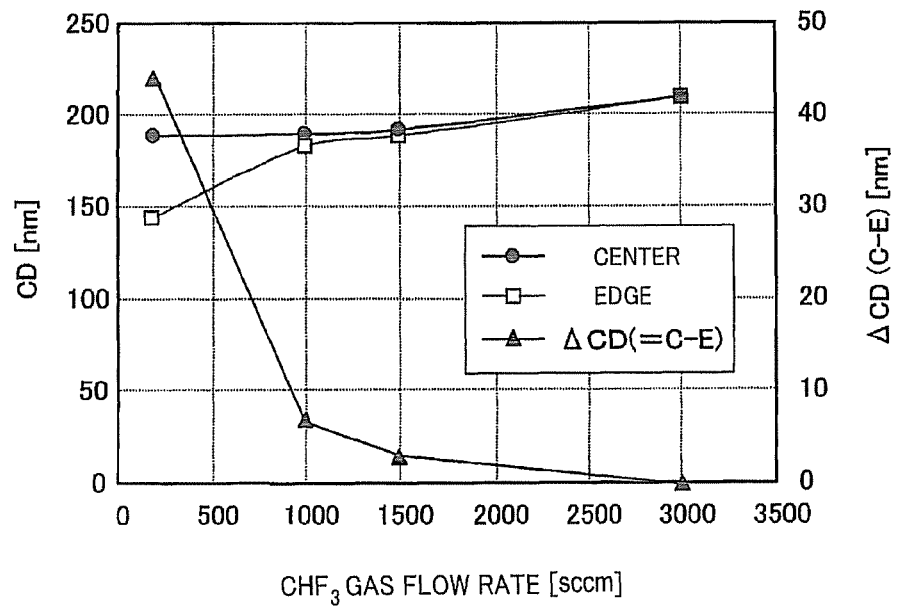
FIG. 9C is a diagram showing a relationship between a flow rate of a processing gas, groove widths (CD) at a center portion and an edge portion of a wafer and a dimensional difference ΔCD therebetween, in a case of using the wafer having a dense resist pattern in which a ratio between a line width and a groove width of a trench is about 1:3.
Figure 9D:
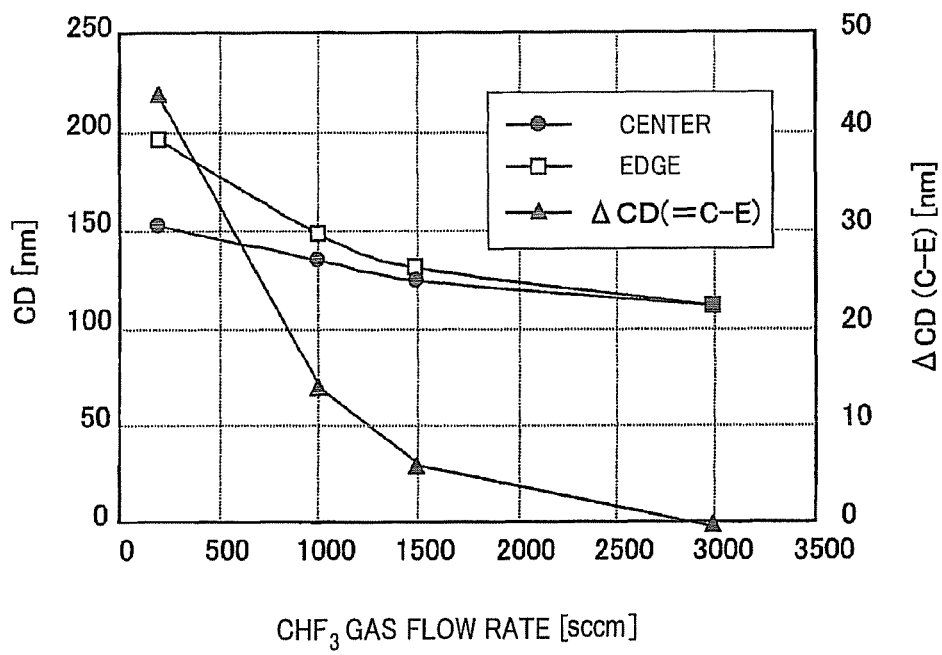
FIG. 9D is a diagram showing a relationship between a flow rate of a processing gas, groove widths (CD) at a center portion and an edge portion of a wafer and a dimensional difference ΔCD therebetween, in a case of using the wafer having a coarse resist pattern in which a ratio between a line width and a groove width of a trench is irregular.

Further, FIGS. 9A to 9D show an experiment result of performing the same experiment as described above while varying resist patterns. FIGS. 9A, 9B and 9C show a case of dense resist patterns, while FIG. 9D shows a case of a coarse resist pattern. Further, FIGS. 9A, 9B and 9C illustrate cases in which a ratio between a line width and a groove width is 1:1, 1:2 and 1:3, respectively. The same experiment as described above was performed for wafers having such different resist patterns, and the result is provided in graphs of FIGS. 9A to 9D. In each graph, a horizontal axis indicates a flow rate of a $CHF_3$ gas, and a vertical axis indicates groove widths (CD) at center portions and edge portions of the wafers and a dimensional difference $\Delta CD$ between them.

As can be seen from FIGS. 9A to 9D, as compared to the case of supplying a $CHF_3$ gas at a low flow rate of 200 sccm, dimensional difference $\Delta CD$ between a center portion and an edge portion is found to be reduced in all cases where the $CHF_3$ gas is supplied at high flow rates equal to or greater than 1000 sccm. Further, when the $CHF_3$ gas is supplied at a flow rate range from 1000 sccm to 3000 sccm, the dimensional difference $\Delta CD$ between the center portion and the edge portion is found to decrease as the flow rate of the $CHF_3$ gas increases. Besides, a decreasing rate of the dimensional difference $\Delta CD$ is found to increase as the density of the resist pattern decreases.

As described above, in the present embodiment, by supplying the processing gas at a high flow rate equal to or greater than about 1000 sccm while increasing radical density by setting the internal pressure of the processing chamber 102 to be as high as, e.g., about 100 mTorr or greater, non-uniformity in an deposition amount of the deposit 270 on the surface of the wafer can be suppressed. Accordingly, non-uniformity in CD of trenches formed after the etching can also be suppressed, and, thus, trenches can be formed as designed on the entire surface region of the wafer.

In view of the above experiment results, when the processing gas is a $CHF_3$ gas, it may be desirable to set the flow rate of the processing gas to range from about 1000 sccm to about 3000 sccm. More desirably, the flow rate may be set to be equal to or higher than about 1500 sccm but not greater than about 3000 sccm.

Further, in the above experiment, although the internal pressure of the processing chamber 102 is fixed at about 150 mTorr, the pressure is not limited thereto but it may be set to be higher than about 150 mTorr. Moreover, as the pressure within the processing chamber 102 is increased, uniform deposition of the deposit on a sidewall of an opening can be more facilitated.

(Result of Experiment Conducted While Varying an Internal Pressure of the Processing Chamber)

In an experiment, a flow rate of a $CHF_3$ gas was fixed and a deposition process was performed while varying a pressure in the processing chamber 102. An experiment result will be explained with reference to the accompanying drawings. Here, the flow rate of the $CHF_3$ gas was fixed at a low flow rate of about 100 sccm, and a case of setting the internal pressure of the processing chamber 102 to be equal to or higher than about 150 mTorr (150 mTorr, 200 mTorr and 250 mTorr) and a case of setting the pressure within the processing chamber 102 to be about 75 mTorr will be compared.

Figure 10:
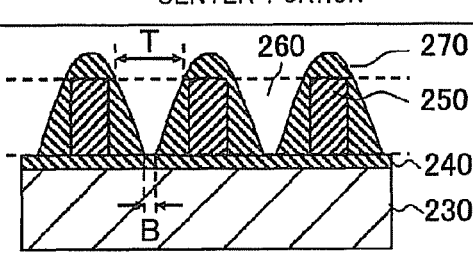
FIG. 10 is a diagram showing an experiment result of measuring groove widths (CD) at a top and a bottom of an opening at a center portion of a wafer while varying an internal pressure of a processing chamber in the deposition process.
Figure 10:
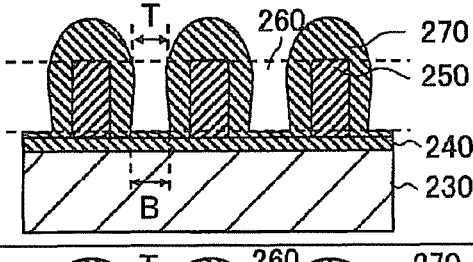
Figure 10:
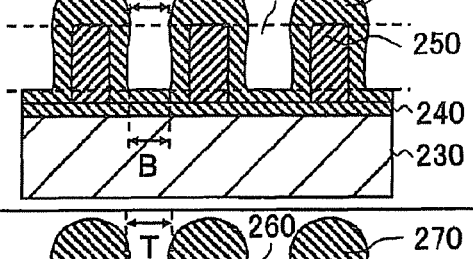
Figure 10:
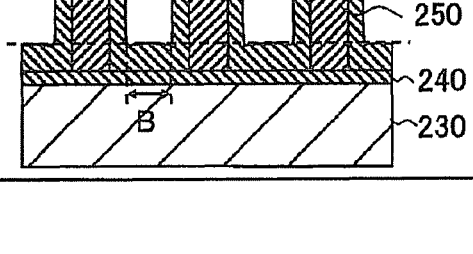
Figure 11:
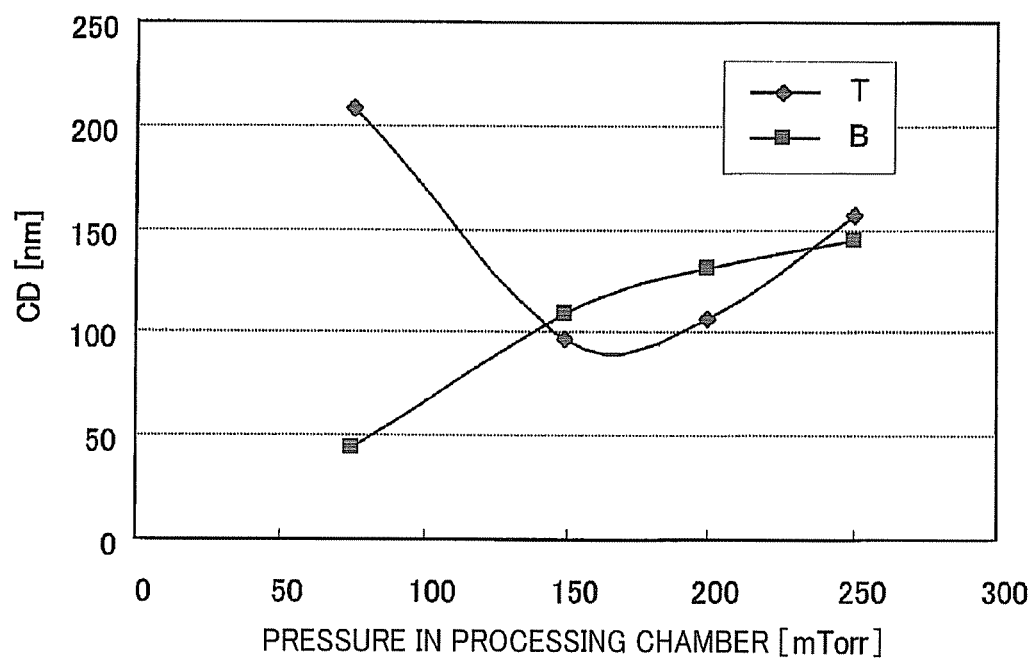
FIG. 11 is a graph showing the groove widths CD at the top and the bottom of the opening of FIG. 10.

FIG. 10 shows a result of measuring and comparing groove widths (CD) of a top portion and a bottom portion of an opening after the deposition process is performed in each case. FIG. 11 is a graph in which a vertical axis indicates a groove width (CD) and a horizontal axis indicates an internal pressure of the processing chamber. Other processing conditions are the same as those described in the above.

Referring to FIGS. 10 and 11, when the internal pressure of the processing chamber 102 is as low as 75 mTorr, a deposit is deposited on a sidewall of an opening in an inclined manner such that a groove width decreases from a top portion toward a bottom portion of the opening.

In contrast, when the pressure is as high as 150 mTorr or greater, the deposit is vertically deposited on a sidewall of an opening such that a groove width hardly changes from a top portion to a bottom portion of the opening. Besides, a dimensional difference between the top portion and the bottom portion of the opening is found to decrease as the internal pressure of the processing chamber 102 increases within a pressure range of about 150 mTorr to about 250 mTorr.

As can be seen from the experiment result in FIGS. 10 and 11 as state above, it may be desirable to set the internal pressure of the processing chamber 102 to be equal to or higher than about 150 mTorr in order to reduce a dimensional difference between a top portion and a bottom portion of an opening. Further, when the flow rate of the $CHF_3$ gas is as low as about 100 sccm as in the experiment shown in FIGS. 10 and 11, a deposition amount in a bottom portion of the opening may increase as the internal pressure of the processing chamber 102 increases.

Figure 8A:
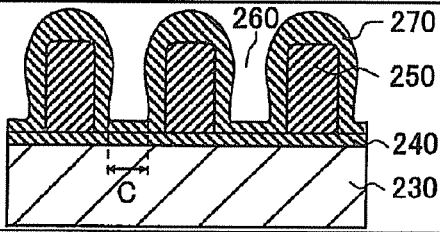
FIG. 8A is a diagram for comparing openings at a center portion and an edge portion of a wafer W when the flow rate of the processing gas is set to about 200 sccm in FIG. 7.
Figure 8B:
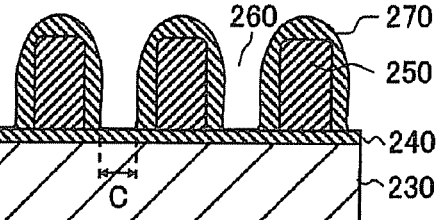
FIG. 8B is a diagram for comparing openings at a center portion and an edge portion of a wafer W when the flow rate of the processing gas is set to about 1000 sccm in FIG. 7.

If the flow rate of the $CHF_3$ gas is increased to about 1000 sccm or greater, the deposit can be vertically deposited on a sidewall of the opening, as illustrated in FIGS. 8B to 8D, and deposition of the deposit in a bottom portion of the opening can be suppressed.

Figure 12:
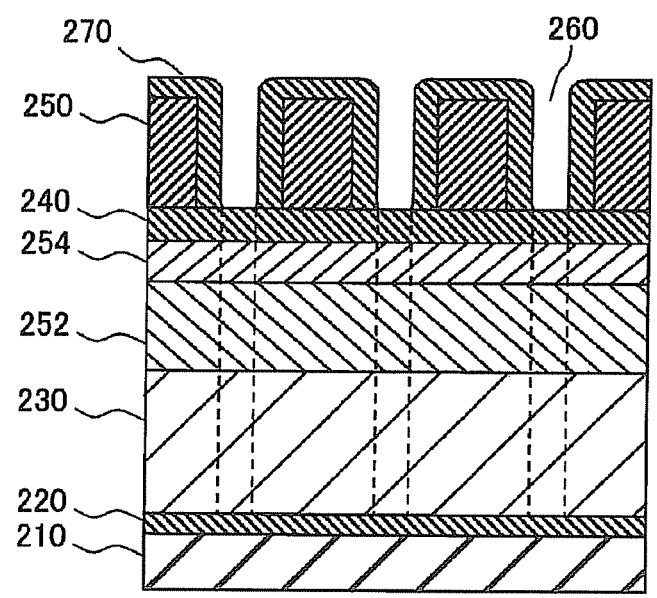
FIG. 12 is a diagram illustrating an example layer structure of another wafer to which the present embodiment is applicable.

Further, although the present embodiment has been described for the case of forming a trench pattern on a wafer W, the present disclosure may be applicable to formation of a hole pattern. Moreover, although a wafer having a resist pattern on an etching target film is used in the deposition process in accordance with the present embodiment, the wafer is not limited thereto. By way of example, a wafer having a lower resist film made of an organic film and formed between an etching target film and a resist pattern may be used. Specifically, as shown in FIG. 12, a wafer having a lower resist film 252 on an etching target film 230, a mask 254 on the lower resist film 252, an antireflection film 240 on the mask 254 and a resist pattern 250 on the antireflection film 240 may be used, and a deposit may be deposited on the resist pattern 250.

Furthermore, although a SiN film is described as an etching target film in the present embodiment, the etching target film is not limited thereto. For example, the etching target film 230 may be any kind of thin film as long as it can be etched by using the resist pattern 250 as a mask. By way of example, the etching target film 230 may be a metal film such as a Ti film or a TiN film, a TEOS film as well as an oxide film such as $SiO_2$, a nitride film such as SiN, a Si film, or the like.

Further, desirably, a residence time of the processing gas in the deposition process may be set to be equal to or less than about 0.1 second to facilitate deposition of a deposit on a sidewall of an opening rather than on a bottom thereof.

Here, the residence time means a time period during which a processing gas contributes to a process in the processing chamber 102. A residence time $\tau$ (s) can be calculated from the following Eq. (1). In the Eq. (1), V ($m^3$) is an effective volume of the inside of the processing chamber calculated by multiplying a lower electrode area (a sum of an area of the wafer W and an area of the focus ring 119 in FIG. 1) by a distance between upper and lower electrodes, i.e., a volume of a space in which the processing gas is excited into plasma; S ($m^3$/sec), a gas exhaust rate; p (Pa), an internal pressure of the processing chamber 102; and Q (Pa·$m^3$/sec), a total flow rate of the processing gas.

$$\tau = V/S = pV/Q \tag{1}$$

Further, a medium such as a storage medium storing therein a software program for implementing the functions of the aforementioned embodiment may be provided to a system or an apparatus, and the program stored in the medium such as the storage medium may be read out and executed by a computer (CPU or a MPU) of the system or the apparatus, so that the present disclosure may be implemented.

In such a case, the program itself read out from the medium such as the storage medium may implement the functions of the aforementioned embodiment, and the present disclosure may be embodied by the medium such as the storage medium storing therein the program. By way of example, the medium such as the storage medium for supplying the program may be a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, a ROM, or the like. Alternatively, the program may be downloaded into the medium through a network.

Furthermore, the present disclosure includes not only a case in which the functions of the aforementioned embodiment are implemented by executing the program read out by the computer but also a case in which an OS (Operating System) or the like operated on the computer executes a part or all of actual processes based on instructions of the program such that the functions of the aforementioned embodiment can be implemented by these processes.

Moreover, the present disclosure also includes a case in which the program read from the storage medium is written in a memory provided in a function extension board inserted into the computer or in a function extension unit connected to the computer, and then a CPU or the like included in the extension board or the extension unit executes a part or all of the actual processes based on instructions of the program such that the functions of the aforementioned embodiment can be implemented by these processes.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, although the present embodiment has been described for the case of using the plasma processing apparatus that generates plasma by applying two kinds of high frequency powers to the lower electrode, the type of the plasma processing apparatus is not limited thereto. For instance, the plasma processing apparatus may be of a type that applies a single high frequency power to a lower electrode or may be of a type that applies two different kinds of high frequency powers to an upper electrode and a lower electrode, respectively. Further, a substrate processing apparatus to which the present disclosure is applicable is not limited to a plasma processing apparatus but may be a heat treating apparatus that performs a film forming process.

The present disclosure has many advantages when it is applied to a substrate processing method, a substrate processing apparatus and a storage medium for performing a deposition process for depositing a thin film on a substrate such as a semiconductor wafer, a FPD substrate, or the like.

What is claimed is:

1. A substrate processing method for performing a preset process on a substrate mounted on a lower electrode by using plasma of a gas excited by applying a high frequency power between an upper electrode and the lower electrode installed to face each other in an evacuable processing chamber, the method comprising:
   depositing a deposit on a sidewall of each opening of a resist pattern, which is formed on an antireflection film on an etching target film of the substrate and is provided with a plurality of openings, before etching the etching target film of the substrate,
   wherein the depositing of the deposit comprises generating plasma by introducing a CHF-based gas into the processing chamber at a flow rate equal to or higher than about 1000 sccm while a pressure in the processing chamber is set to be equal to or higher than about 100 mTorr.

2. The substrate processing method of claim 1, wherein the CHF-based gas is a $CHF_3$ gas.

3. The substrate processing method of claim 2, wherein a flow rate of the $CHF_3$ gas ranges from about 1500 sccm to about 3000 sccm in the depositing process.

4. The substrate processing method of claim 3, wherein the pressure in the processing chamber is equal to or higher than about 150 mTorr in the depositing process.

5. The substrate processing method of claim 1, wherein a residence time of the gas is equal to or less than about 0.1 second in the depositing process.

6. The substrate processing method of claim 1, wherein a lower resist film is formed between the etching target film and the antireflection film of the substrate.

* * * * *